US012198036B2

(12) United States Patent
Tomita et al.

(10) Patent No.: US 12,198,036 B2
(45) Date of Patent: Jan. 14, 2025

(54) SPIKE TIMING DEPENDENT PLASTICITY WRITE METHOD AND SYNAPSE ARRAY APPARATUS

(71) Applicant: Winbond Electronics Corp., Taichung (TW)

(72) Inventors: Yasuhiro Tomita, Kanagawa (JP); Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 912 days.

(21) Appl. No.: 17/324,062

(22) Filed: May 18, 2021

(65) Prior Publication Data

US 2021/0390373 A1    Dec. 16, 2021

(30) Foreign Application Priority Data

Jun. 11, 2020 (JP) .................................. 2020-101399

(51) Int. Cl.
    *G11C 11/00*     (2006.01)
    *G06N 3/049*     (2023.01)
    (Continued)

(52) U.S. Cl.
    CPC ............. *G06N 3/049* (2013.01); *G06N 3/065* (2023.01); *G11C 13/0069* (2013.01)

(58) Field of Classification Search
    CPC ........ G06N 3/049; G06N 3/065; G06N 3/088; G06N 3/04; G06N 3/08; G06N 3/063;
    (Continued)

(56) References Cited

U.S. PATENT DOCUMENTS 9,269,042 B2    2/2016    Friedman et al.
2012/0084241 A1*    4/2012    Friedman ................. G06N 3/08
                                                                          706/27

(Continued)

FOREIGN PATENT DOCUMENTS

| CN | 102341815 | 2/2012 |
|----|-----------|--------|
| CN | 102971753 | 3/2013 |

(Continued)

OTHER PUBLICATIONS

"Office Action of China Counterpart Application", issued on Jul. 31, 2023, p. 1-p. 6.

*Primary Examiner* — Hien N Nguyen
(74) *Attorney, Agent, or Firm* — JCIPRNET (57) ABSTRACT

A resistance variable type synapse array apparatus that can perform STDP writing using a positive potential is provided. The synapse array apparatus includes a writing unit writing to a selected resistance variable type memory element in a crossbar array. The writing unit includes a driver generating a positive pulse signal corresponding to a positive part of a spike signal generated by a presynaptic neuron, a driver generating a positive pulse signal corresponding to a negative part of a spike signal generated by a postsynaptic neuron, a driver generating a positive pulse signal corresponding to a positive part of the spike signal generated by the postsynaptic neuron, and a driver generating a positive pulse signal corresponding to a negative part of the spike signal generated by the presynaptic neuron.

10 Claims, 6 Drawing Sheets

(51) Int. Cl.
*G06N 3/065* (2023.01)
*G11C 13/00* (2006.01)

(58) Field of Classification Search
CPC ............ G11C 13/0069; G11C 2213/72; G11C 2213/79; G11C 13/0026; G11C 13/0028; G11C 13/0061; G11C 2013/0092; G11C 2213/77; G11C 11/54; G06F 2218/14
See application file for complete search history.

(56) References Cited

U.S. PATENT DOCUMENTS

| | | | |
|---|---|---|---|
| 2017/0271004 A1* | 9/2017 | Jeon | G11C 13/0033 |
| 2018/0211162 A1* | 7/2018 | Burr | G06F 3/067 |
| 2019/0213468 A1* | 7/2019 | Chen | G06N 3/065 |
| 2020/0065658 A1* | 2/2020 | Akopyan | G06N 3/06 |
| 2022/0138546 A1* | 5/2022 | Kwak | G11C 11/2253 |
| | | | 706/33 |
| 2022/0188607 A1* | 6/2022 | Zhang | G06N 3/04 |

FOREIGN PATENT DOCUMENTS

| | | |
|---|---|---|
| CN | 103189880 | 7/2013 |
| CN | 106845634 | 6/2017 |
| CN | 109034379 | 12/2018 |
| CN | 109416759 | 3/2019 |
| TW | I682331 | 1/2020 |

\* cited by examiner

SPIKE TIMING DEPENDENT PLASTICITY WRITE METHOD AND SYNAPSE ARRAY APPARATUS

CROSS-REFERENCE TO RELATED APPLICATION

This application claims the priority benefit of Japan application serial no. 2020-101399, filed on Jun. 11, 2020. The entirety of the above-mentioned patent application is hereby incorporated by reference herein and made a part of this specification.

BACKGROUND

Technical Field

The disclosure relates to a crossbar array using a resistance variable type memory element, and in particular to a spike timing dependent plasticity (STDP) writing to the resistance variable type memory element.

Description of Related Art

The so-called synapse refers to a contact structure developed between an output side and an input side of neural information for information transmission. The most basic structure is that an axon terminal of a presynaptic neuron is in contact with a dendrite of a postsynaptic neuron. When the presynaptic neuron and the postsynaptic neuron both discharge continuously at a high frequency, the transmission efficiency of synapse increases. In recent years, it has been known that due to only the difference in discharging times of the presynaptic neuron and the postsynaptic neuron, changes in bonding strength has emerged, which is referred to as spike timing dependent plasticity (STDP).

For example, Patent Document 1 (U.S. Pat. No. 9,269, 042) relates to a neuron network that generates STDP. The neuron network has multiple electronic neurons and an interconnection circuit for interconnecting to bond the electronic neurons. The interconnection circuit includes multiple synaptic apparatuses for interconnecting the electronic neurons via axons, dendrites, and other pathways. Each synaptic apparatus includes a variable resistor and a transistor. Each synaptic apparatus is bonded between the axon and the dendrite.

SUMMARY

Artificial neural network is introduced as a software algorithm in pattern recognition and other recognition and classification technologies, and has become a necessary technology for installation by a highly-integrated digital complementary metal oxide semiconductor (CMOS). However, neural networks installed by digital technology have gradually reached the limits in terms of power and scale. Scale, power, and cost are the focus especially in the field of the Internet of things (IoT) that is expected in the future, so it is difficult to directly introduce such neural networks into the equipment. On the other hand, in recent years, research and development of neural networks that use resistive elements as synapses are ongoing, which is low-power and small-scale, and has made progress in the practical use of neural networks that achieve the ultimate learning function.

It is known that memory and learning of the brain are related to the bonding strength of the synapse of the neural network. Potential pulses are used when carrying out signal transmission, and due to the time difference between two potential pulses, the bonding strength of the synapse is adjusted, which is STDP and plays an important role in memory and learning of the brain.

Figure 1:
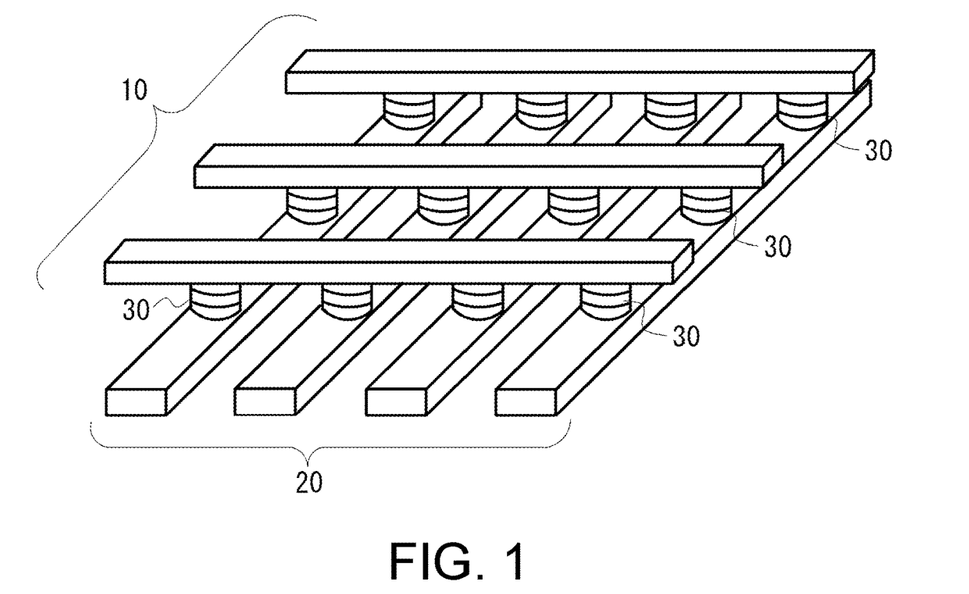
FIG. 1 is a structural diagram showing an example of a crossbar array.

FIG. 1 shows an example of a crossbar array using a variable resistance element. The crossbar array includes multiple row lines 10 extending in a row direction, multiple column lines 20 extending in a column direction in a manner orthogonal to the row lines 10, and a memristor 30 connected to an intersection of each of the row lines 10 and each of the column lines 20. The memristor 30 is, for example, a non-volatile resistance variable type memory element that memorizes different resistive states by applying voltage or current.

In the case of applying the crossbar array to a neuron network, an STDP electrical signal is written to the memristor (resistance variable type memory element) 30 to adjust the bonding strength of the synapse.

Figure 2:
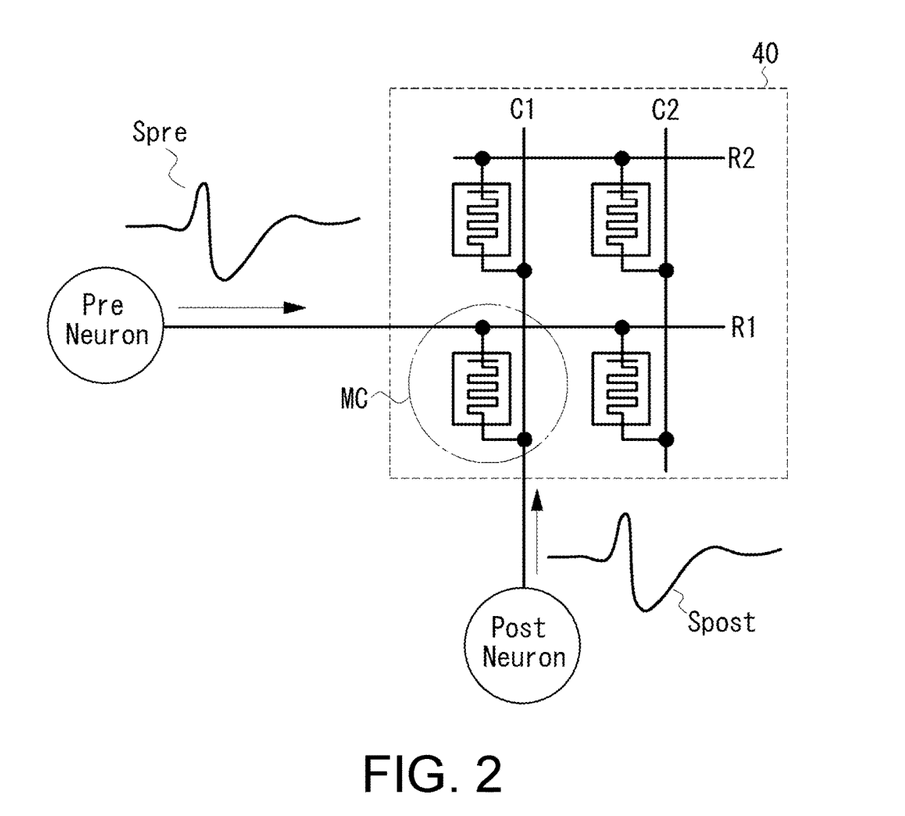
FIG. 2 is a diagram illustrating a spike timing dependent plasticity (STDP) to a crossbar array using a resistance variable type memory element.

FIG. 2 is a diagram illustrating a principle of an STDP write method. In FIG. 2, two row lines R1 and R2, two column lines C1 and C2, and four resistance variable type memory elements connected to the intersections as a part 40 of the crossbar array are shown. In the example, it is assumed that a resistance variable type memory element MC is selected, the row line R1 represents a presynaptic neuron (that is, a pre neuron), the column line C1 represents a postsynaptic neuron (that is, a post neuron), and the resistance variable type memory element MC represents a synapse.

The resistance variable type memory element is composed of metal transition oxides such as hafnium oxide, and is a bipolar type that reverses the polarity of a write voltage applied during setting/resetting. The setting is to set the resistance variable type memory element to a low resistive state, and the resetting is to set the resistance variable type memory element to a high resistive state. For example, the application of the write voltage from the row line R1 is the setting, and the application of the write voltage from the column line C1 is the resetting. A spike signal Spre is applied to the row line R1. A spike signal Spost is applied to the column line C1. A difference between the spike signals Spre and Spost generated by the presynaptic neuron and the postsynaptic neuron is written to the resistance variable type memory element MC, so that the conductance of the resistance variable type memory element MC, that is, the bonding strength of the synapse is adjusted.

Figure 3A:
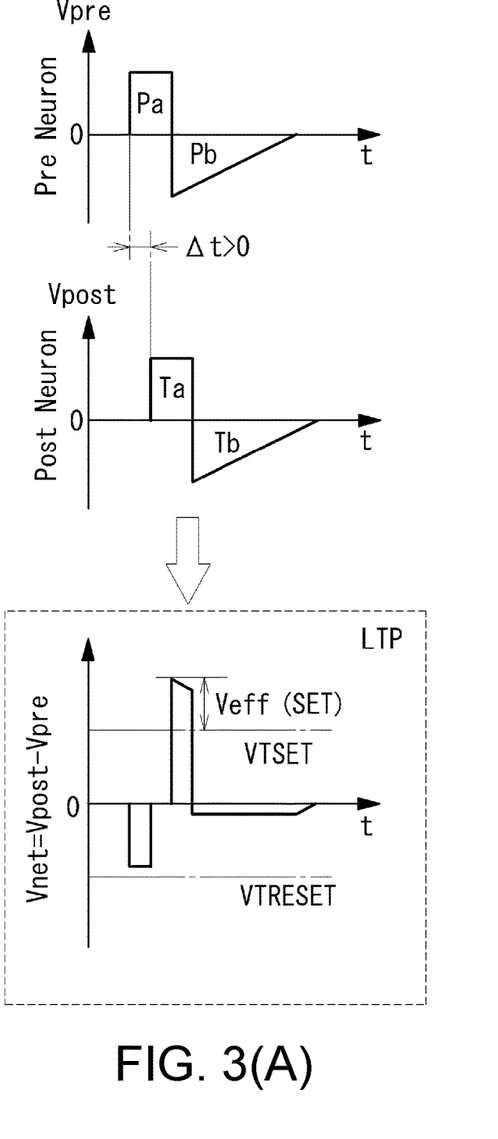
FIG. 3(A) and FIG. 3(B) are diagrams showing pulse waveforms when performing STDP writing.
Figure 3B:
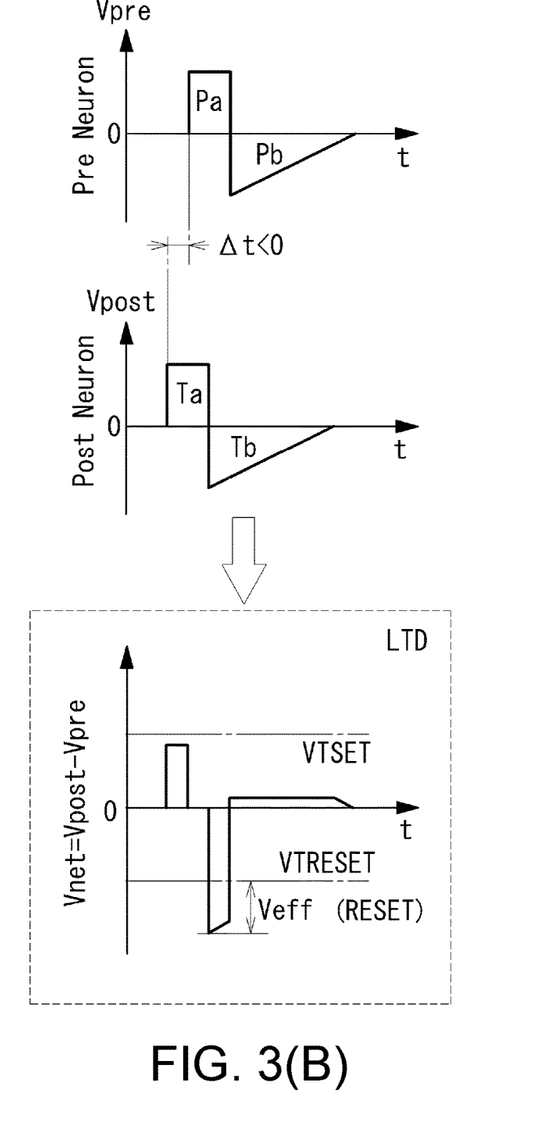

FIG. 3(A) shows an example in which the bonding strength of the synapse is potentiated by STDP, and FIG. 3(B) shows an example in which the bonding strength of the synapse is depressed by STDP. The actual writing to the resistance variable type memory element MC is performed using a pulse-like voltage signal Vpre/Vpost obtained by approximating the spike signal Spre/Spost. The voltage signal Vpre is a pulse signal generated by the presynaptic neuron, and the voltage signal Vpost is a pulse signal generated by the postsynaptic neuron. The voltage signal Vpre/Vpost consists of a positive rectangular wave pulse (Pa/Ta) and a steep negative triangular wave pulse (Pb/Tb) that slowly attenuates from a negative potential.

As shown in FIG. 3(A), when the voltage signal Vpre is generated earlier than the voltage signal Vpost ($\Delta t>0$), a positive pulse that is Veff greater than a threshold VTSET of writing during setting is generated in a potential difference Vnet of Vpost−Vpre. If the pulse is repeated multiple times, the conductance of the resistance variable type memory element MC increases, that is, the bonding strength of the synapse is potentiated (that is, long term potentiation (LTP)).

On the contrary, as shown in FIG. 3(B), when the voltage signal Vpre is generated later than the voltage signal Vpost (Δt<0), a negative pulse that is Veff greater than a threshold VTRESET of writing during resetting is generated in the potential difference Vnet of Vpost−Vpre. If the pulse is repeated multiple times, the conductance of the resistance variable type memory element MC decreases, that is, the bonding strength of the synapse is depressed (that is, long term depression (LTD)).

Figure 4:
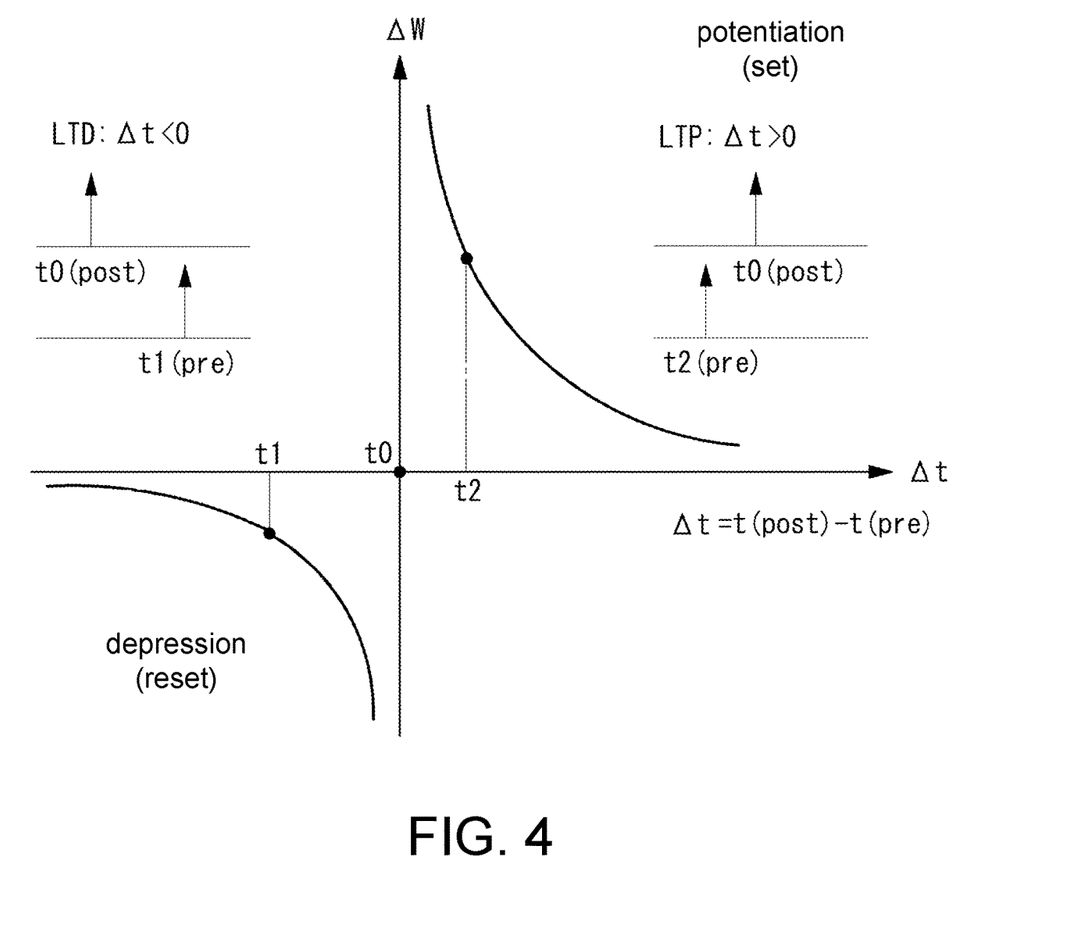
FIG. 4 is a diagram illustrating an STDP learning rule.

The relationship between the time difference Δt of Vpost-Vpre and a change Δw of the bonding strength of the synapse is referred to as the STDP learning rule, and the relationship is shown in the graph of FIG. 4. As shown in FIG. 4, the relationship between Δt and Δw is represented by a right-angled hyperbola. A bipolar resistance variable type memory element that may perform writing in different polarities is a device suitable for expressing the bonding strength of the synapse. However, the potential difference Vnet of VPost−Vpre includes a negative potential or a negative pulse, so peripheral circuits of the crossbar array must process the negative potential. For example, an internal circuit for generating the negative potential or a negative power supply is required. Therefore, the semiconductor manufacturing process must be triple-well. As a result, the manufacturing cost of the device increases and the current consumption increases.

The disclosure provides a resistance variable type synapse array apparatus that can perform STDP writing using a positive potential.

A write method of the disclosure performs STDP writing on a crossbar array using a bipolar resistance variable type memory element. A first driver using a positive potential generates a first voltage signal corresponding to a positive part of a spike signal generated by a presynaptic neuron, and a second driver using a positive potential generates a second voltage signal corresponding to a negative part of a spike signal generated by a postsynaptic neuron. A third driver using a positive potential generates a third voltage signal corresponding to a positive part of the spike signal generated by the postsynaptic neuron. A fourth driver using a positive potential generates a fourth voltage signal corresponding to a negative part of the spike signal generated by the presynaptic neuron. The first voltage signal and the second voltage signal are added to obtain a first drive signal, which is applied to a terminal of a selected resistance variable type memory element. The third voltage signal and the fourth voltage signal are added to obtain a second drive signal, which is applied to another terminal of the selected resistance variable type memory element.

In an embodiment, the first drive signal is a write voltage during setting or resetting, and the second drive signal is a write voltage during resetting or setting. STDP is a difference between the spike signal generated by the presynaptic neuron and the spike signal generated by the postsynaptic neuron. The first drive signal and the second drive signal are positive pulse signals. The first voltage signal is a positive rectangular wave pulse signal, the second voltage signal is a positive triangular wave pulse signal, the third voltage signal is a positive rectangular wave pulse signal, and the fourth voltage signal is a positive triangular wave pulse signal.

A synapse array apparatus of the disclosure includes a crossbar array using a bipolar resistance variable type memory element; a selection unit for selecting the resistance variable type memory element of the crossbar array; and a writing unit for writing to the resistance variable type memory element. The writing unit includes a first driver and a second driver with positive potentials connected to a terminal of the resistance variable type memory element, and a third driver and a fourth driver with positive potentials connected to another terminal. The first driver generates a first voltage signal corresponding to a positive part of a spike signal generated by a presynaptic neuron. The second driver generates a second voltage signal corresponding to a negative part of a spike signal generated by a postsynaptic neuron. The third driver generates a third voltage signal corresponding to a positive part of the spike signal generated by the postsynaptic neuron. The fourth driver generates a fourth voltage signal corresponding to a negative part of the spike signal generated by the presynaptic neuron. The writing unit applies a first drive signal obtained by adding the first voltage signal and the second voltage signal to a terminal of a selected resistance variable type memory element, and applies a second drive signal obtained by adding the third voltage signal and the fourth voltage signal to another terminal of the selected resistance variable type memory element.

In an embodiment, the resistance variable type memory element includes a selector device, the selector device is a diode or a transistor.

According to the disclosure, the first to fourth voltage signals are generated using the first driver to fourth drivers with positive potentials, the first drive signal obtained by adding the first voltage signal and the second voltage signal is applied to a terminal of the selected resistance variable type memory element, and the second drive signal obtained by adding the third voltage signal and the fourth voltage signal is applied to another terminal of the selected resistance variable type memory element, so that STDP writing using a positive potential may be performed on the resistance variable type memory element.

DETAILED DESCRIPTION OF DISCLOSED EMBODIMENTS

Next, embodiments of the disclosure will be described in detail with reference to the drawings. In an embodiment of the disclosure, a crossbar array is used as a synaptic array apparatus that constitutes a neural network of artificial intelligence (AI) hardware. An intersection in a matrix of the crossbar array includes a resistance variable type memory element as a memristor. The resistance variable type memory element is a bipolar type and may memorize different conductance states (high resistive state and low resistive state) by applying current or voltage with different polarities. The resistance variable type memory element constitutes a synapse. The crossbar array constitutes a synapse array apparatus. The synapse array apparatus is assembled into a computer apparatus or a computer system and is responsible for at least a part of data processing or algorithm processing performed by a microprocessor, a central processing unit (CPU), etc.

Embodiments

Figure 5:
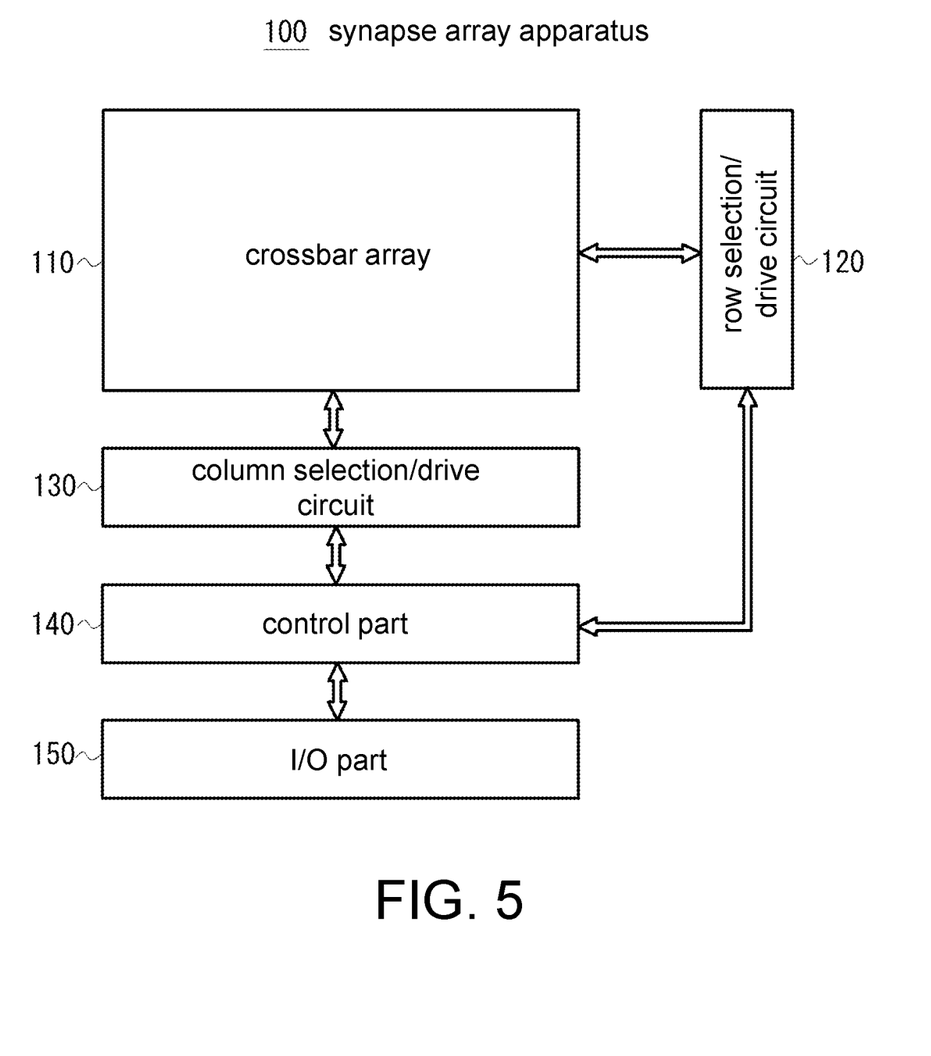
FIG. 5 is a block diagram showing an example of a synapse array apparatus according to an embodiment of the disclosure.

FIG. 5 is a structural block diagram showing an example of a synapse array apparatus according to an embodiment of the disclosure. A synapse array apparatus 100 of the embodiment includes a crossbar array 110 with a resistance variable type memory element, a row selection/drive circuit 120, a column selection/drive circuit 130, a control part 140, and an input/output (I/O) part 150. The synapse array apparatus 100 is, for example, installed in an AI chip or a semiconductor integrated circuit.

For example, as shown in FIG. 1, the crossbar array 110 includes multiple row lines extending in a row direction, multiple column lines extending in a column direction, and a resistance variable type memory element connected to an intersection between the row line and the column line. The resistance variable type memory element is constructed using metal transition oxides such as hafnium oxide (HfOx) or tantalum oxide (TaOx). The number, shape, conductive material, etc. of the row lines and the column lines are arbitrary. In addition, the crossbar array 110 may be formed by stacking multiple pairs of the crossbar array as shown in FIG. 1 in a perpendicular direction.

The row selection/drive circuit 120 selects the row line of the crossbar array 110 based on a row selection signal, a control signal, etc. from the control part 140, and applies a write voltage or a read voltage to the selected row line or applies a write inhibit voltage, etc. to a non-selected row line. As described later (refer to FIG. 7), the row selection/drive circuit 120 includes two independently operable row_positive part driver 122 and row_negative part driver 124, and an adder 126. The two drivers 122 and 124 operate using positive potentials. The row_positive part driver 122 generates a voltage signal corresponding to a positive part of a spike signal generated by a presynaptic neuron (that is, a pre neuron), and the row_negative part driver 124 generates a voltage signal corresponding to a negative part of a spike signal generated by a postsynaptic neuron (that is, a post neuron).

The column selection/drive circuit 130 selects the column line of the crossbar array 110 based on a column selection signal, a control signal, etc. from the control part 140, and applies a write voltage or a read voltage to the selected column line or applies a write inhibit voltage, etc. to a non-selected column line. As described later (refer to FIG. 7), the column selection/drive circuit 130 includes two independently operable column_positive part driver 132 and column_negative part driver 134, and an adder 136. The two drivers 132 and 134 operate using positive potentials. The column_positive part driver 132 generates a voltage signal corresponding to a positive part of the spike signal generated by the postsynaptic neuron, and the column_negative part driver 134 generates a voltage signal corresponding to a negative part of the spike signal generated by the presynaptic neuron.

The control part 140 is composed of hardware and/or software, and controls a read operation or a write operation. In an embodiment, the control part 140 includes a microcontroller, a microprocessor, a state machine, etc. with a read-only memory/random-access memory (ROM/RAM), and for example, controls the read operation or the write operation by executing the software stored in the ROM/RAM.

In the embodiment, the control part 140 includes the function of performing STDP writing on the resistance variable type memory element of the crossbar array section 110. The control part 140 applies a drive signal Vpre equivalent to the spike signal generated by the presynaptic neuron to the selected row line via the row selection/drive circuit 120, and applies a drive signal Vpost equivalent to the spike signal generated by the postsynaptic neuron to the selected column line via the column selection/drive circuit 130. The drive signal Vpre applied to the row line is a signal obtained by adding the voltage signal generated by the row_positive part driver 122 and the voltage signal generated by the row_negative part driver 124, which corresponds to the writing of the resistance variable type memory element during setting. The drive signal Vpost applied to the column line is a signal obtained by adding the voltage signal generated by the column_positive part driver 132 and the voltage signal generated by the column_negative part driver 134, which corresponds to the writing of the resistance variable type memory element during resetting.

In addition, the controller 140 may include a sensing circuit. When performing the read operation, the sensing circuit senses the voltage or the current of the row line or the column line selected by the row selection/drive circuit 120 or the column selection/drive circuit 130.

The input/output part 150 is connected to the control part 140 via, for example, an internal data bus, and provides data received from the outside to the control part 140 or outputs the data received from the control part 140 to the outside. The control part 140 may obtain data for performing STDP writing on the resistance variable type memory element MC from the input/output part 150.

Figure 6A:
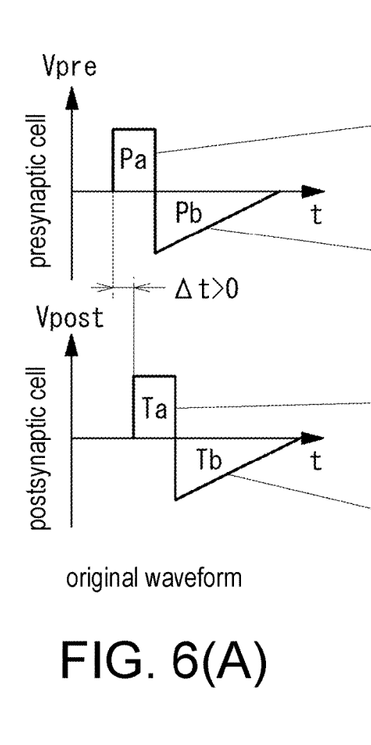
FIG. 6(A) to FIG. 6(D) are diagrams illustrating a performance of an STDP write method on a crossbar array using a resistance variable type memory element according to an embodiment of the disclosure.

Next, the STDP write method of the embodiment will be described with reference to FIG. 6(A) to FIG. 6(D). FIG. 6(A) shows the original waveforms of the voltage signal Vpre generated by the presynaptic neuron and the voltage signal Vpost generated by the postsynaptic neuron. The voltage signal Vpre includes a positive rectangular wave pulse Pa and a steep negative triangular wave pulse Pb that slowly attenuates from a negative potential. The voltage signal Vpost includes a positive rectangular wave pulse Ta and a steep negative triangular wave pulse Tb that slowly attenuates from a negative potential. Here, it is assumed that the voltage signal Vpre is generated earlier than the voltage signal Vpost ($\Delta t > 0$).

STDP is a process of applying a difference (Vpost-Vpre) between the voltage signal Vpre and the voltage signal Vpost to the resistance variable type memory element. The difference may be converted according to Equation (1).

$$V\text{post} - V\text{pre} = (Ta - Tb) - (Pa - Pb) = (Ta + Pb) - (Pa + TB) \quad (1)$$

In Equation (1), in the case where (Ta+Pb) corresponds to a set writing of the resistance variable type memory element, (Pa+Tb) with a polarity different from (Ta+Pb) may correspond to a reset writing. Alternatively, in the case where (Ta+Pb) corresponds to the reset writing, (Pa+Tb) may correspond to the set writing. In the following example, (Pa+Tb) is set as a set write voltage and (Ta+Pa) is set as a reset write voltage.

Figure 6B:
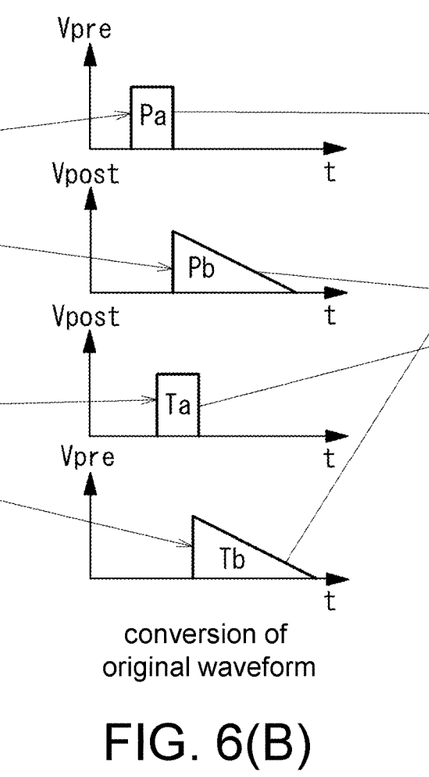

FIG. 6(B) shows a situation where the original voltage signal Vpre and voltage signal Vpost are respectively converted into the four expressions shown in Equation (1). It should be noted here that the negative triangular wave pulse Pb and triangular wave pulse Tb are converted into the positive triangular wave pulse Pb and triangular wave pulse Tb, and the four pulses are all positive. Therefore, the four pulses may be respectively generated by the four drivers using positive potentials.

Figure 6C:
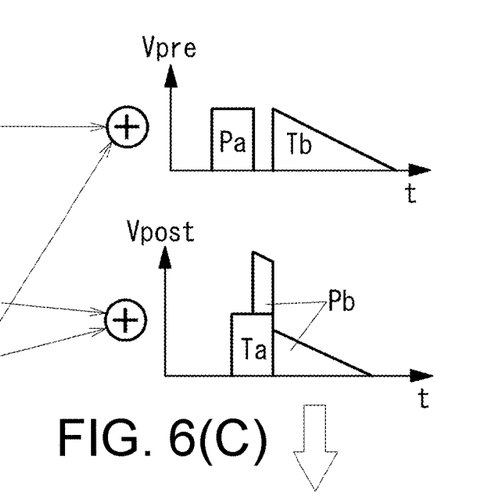
Figure 6D:
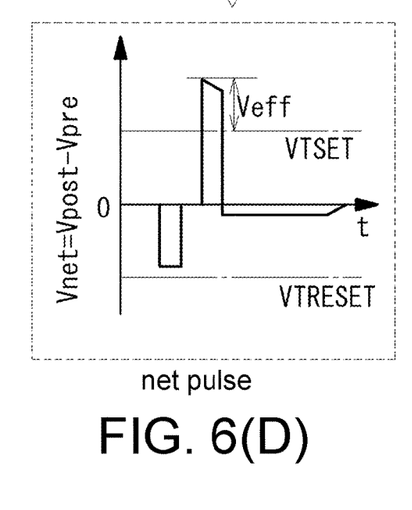

FIG. 6(C) illustrates the drive signal Vpre obtained by synthesizing the rectangular wave pulse Pa of the voltage signal Vpre and the triangular wave pulse Tb of the voltage signal Vpost, and the drive signal Vpost obtained by synthesizing the rectangular wave pulse Ta of the voltage signal Vpost and the triangular wave pulse Pb of the voltage signal Vpre according to Equation (1). FIG. 6(D) illustrates a potential difference Vnet (=Vpost−Vpre) applied to the resistance variable type memory element. When a pulse exceeding a threshold VTSET of the set writing is applied to the resistance variable type memory element, the conductance of the resistance variable type memory element becomes larger, that is, the bonding strength of the synapse is potentiated. Furthermore, although the case of Δt<0 is not shown here, in the case, applying a pulse exceeding the threshold VTRESET of the reset writing to the resistance variable type memory element reduces the conductance of the resistance variable type memory element, that is, the bonding strength of the synapse is attenuated.

Figure 7:
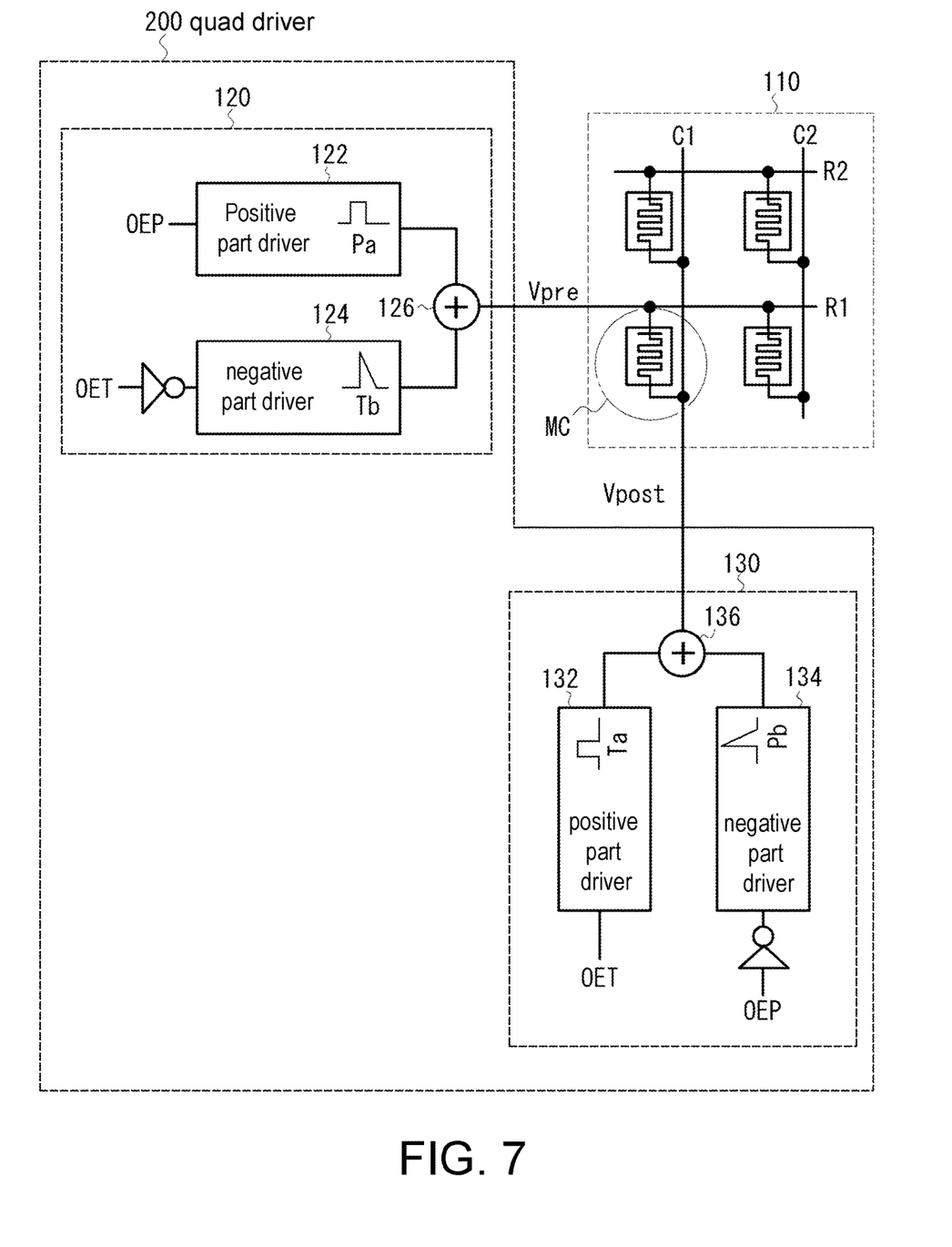
FIG. 7 is a structural diagram showing a quad type writing circuit according to an embodiment of the disclosure.

FIG. 7 shows a quad driver 200 contained in the row selection/drive circuit 120 and the column selection/drive circuit 130 of the embodiment. The quad driver 200 includes the following four drivers: the row_positive part driver 122 and the row_negative part driver 124 contained in the row selection/drive circuit 120, and the column_positive part driver 132 and the column_negative part driver 134 contained in the column selection/drive circuit 130. The row_positive part driver 122 and the row_negative part driver 124 respectively generate pulse signals of (Pa+Tb) of Equation (1), and the column_positive part driver 132 and the column_negative part driver 134 respectively generate pulse signals of (Ta+Pb). The four drivers 122, 124, 132, and 134 generate positive pulse waveforms and all operate with positive potentials instead of negative potentials or negative power supplies.

When performing STDP writing on the resistance variable type memory element MC of the crossbar array 110, the row selection/drive circuit 120 connects the row_positive part driver 122 and the row_negative part driver 124 to the selected row line R1 based on a row address from the control part 140, and the column selection/drive circuit 130 connects the column_positive part driver 132 and the column_negative part driver 134 to the selected column line C1 based on a row column from the control part 140.

The row_positive part driver 122 generates the rectangular wave pulse Pa in response to an enable signal OEP from the control part 140, and the row_negative part driver 124 generates the triangular wave pulse Tb in response to an enable signal OET from the control part 140. The rectangular wave pulse Pa and the triangular wave pulse Tb are synthesized using the adder 126, and the synthesized drive signal Vpre as the set write voltage is applied to a terminal of the resistance variable type memory element MC via the row line R1. In addition, the column_positive part driver 132 generates the rectangular wave pulse Ta in response to the enable signal OET from the control part 140, and the column_negative part driver 134 generates the triangular wave pulse Pb in response to the enable signal OEP from the control part 140. The rectangular wave pulse Ta and the triangular wave pulse Pb are synthesized using the adder 136, and the synthesized drive signal Vpost as the reset write voltage is applied to another terminal of the resistance variable type memory element MC via the column line C1. In addition, the row selection/drive circuit 120 enables the non-selected row line R2 to be in a floating state or applies a write inhibit voltage Vinh to the non-selected row line R2, and the column selection/drive circuit 130 enables the non-selected column line C2 to be in a floating state or applies the write inhibit voltage Vinh to the non-selected column line C2.

The control part 140 may enable the four drivers to operate independently via the enable signals, and apply the drive signal Vpre of (Pa+Tb) and the drive signal Vpost of (Ta+Pb) to the resistance variable type memory element MC in a desired timing. As such, STDP writing is performed on the resistance variable type memory element MC.

As described above, according to the embodiment, by using at least four drivers with positive potentials for one neuron, the peripheral circuits of the crossbar array may perform STDP writing by using a bipolar action with a positive potential without processing negative potentials. In this way, the cost and power consumption of the synapse array apparatus can be reduced.

In the embodiment, the drive signal Vpre/Vpost is applied to the resistance variable type memory element by selecting the row line and the column line. However, if the crossbar array is further integrated or miniaturized, in the control performed by the bias of the row line and the column line, there is a possibility that the isolation from the adjacent resistance variable type memory element is insufficient. Therefore, a selection apparatus (a selector device) for selecting the resistance variable type memory element may also be disposed.

The selection apparatus is, for example, an access transistor, and the resistance variable type memory element includes a variable resistance element and a transistor (1T1R). In this case, the gate of the access transistor is connected to the row line (word line). When the access transistor is conducted, a terminal of the variable resistance element is electrically connected to a bit line, and another terminal is electrically connected to a source line. When performing STDP writing, for example, the drive signal Vpre is applied to the bit line, and the drive signal Vpost is applied to the source line. In addition, as the selection apparatus, variable resistance elements may all be integrated with a diode to prevent undesired current from flowing to non-selected variable resistance elements. In this case, the diode has the following characteristics: when a forward bias voltage becomes a certain value or more, current flows in a forward direction, and when a reverse bias voltage becomes a certain value or more, current flows in a reverse direction.

In the embodiment, the spike signal is approximated to the positive rectangular wave pulse and the negative triangular wave pulse. As a result, the four drivers 122, 124, 132, and 134 with positive potentials are used to perform STDP writing on the resistance variable type memory element, but the disclosure is not limited thereto. For example, in the case where a spike signal is approximated to a positive rectangular wave pulse, a negative rectangular wave pulse, and a negative triangular wave pulse, the drive signal Vpre applied to the row line is the synthesis of positive pulse signals of the three drivers with positive potentials, and the drive signal Vpost applied to the column line is the synthesis of positive pulse signals of the three drivers with positive potentials.

The embodiments of the disclosure have been described in detail, but the disclosure is not limited to specific embodiments. Various modifications and changes may be made within the scope of the spirit of the disclosure described in the appended claims.

What is claimed is:

1. A spike timing dependent plasticity write method, performing spike timing dependent plasticity writing on a crossbar array using a bipolar resistance variable type memory element, wherein a first driver using a positive potential generates a first voltage signal corresponding to a positive part of a spike signal generated by a presynaptic neuron, a second driver using a positive potential generates a second voltage signal corresponding to a spike signal generated by a postsynaptic neuron, a third driver using a positive potential generates a third voltage signal corresponding to a positive part of the spike signal generated by the postsynaptic neuron, and a fourth driver using a positive potential generates a fourth voltage signal corresponding to a negative part of the spike signal generated by the presynaptic neuron, and a first drive signal obtained by adding the first voltage signal and the second voltage signal is applied to a terminal of a selected resistance variable type memory element, and a second drive signal obtained by adding the third voltage signal and the fourth voltage signal is applied to another terminal of the selected resistance variable type memory element.

2. The spike timing dependent plasticity write method according to claim 1, wherein the first drive signal is a write voltage during setting or resetting, and the second drive signal is a write voltage during resetting or setting.

3. The spike timing dependent plasticity write method according to claim 1, wherein spike timing dependent plasticity is a difference between the spike signal generated by the presynaptic neuron and the spike signal generated by the postsynaptic neuron.

4. The spike timing dependent plasticity write method according to claim 1, wherein the first drive signal and the second drive signal are positive pulse signals.

5. The spike timing dependent plasticity write method according to claim 4, wherein the first voltage signal is a positive rectangular wave pulse signal, the second voltage signal is a positive triangular wave pulse signal, the third voltage signal is a positive rectangular wave pulse signal, and the fourth voltage signal is a positive triangular wave pulse signal.

6. A synapse array apparatus, comprising:

a crossbar array, using a bipolar resistance variable type memory element;

a selection unit, selecting the resistance variable type memory element of the crossbar array; and a writing unit, writing to the resistance variable type memory element, wherein the writing unit comprises a first driver and a second driver with positive potentials connected to a terminal of the resistance variable type memory element, and a third driver and a fourth driver with positive potentials connected to another terminal, the first driver generates a first voltage signal corresponding to a positive part of a spike signal generated by a presynaptic neuron, the second driver generates a second voltage signal corresponding to a negative part of a spike signal generated by a postsynaptic neuron, the third driver generates a third voltage signal corresponding to a positive part of the spike signal generated by the postsynaptic neuron, and the fourth driver generates a fourth voltage signal corresponding to a negative part the spike signal generated by the presynaptic neuron, and the writing unit applies a first drive signal obtained by adding the first voltage signal and the second voltage signal to a terminal of a selected resistance variable type memory element, and applies a second drive signal obtained by adding the third voltage signal and the fourth voltage signal to another terminal of the selected resistance variable type memory element.

7. The synapse array apparatus according to claim 6, wherein the first drive signal is a write voltage during setting or resetting, and the second drive signal is a write voltage during resetting or setting.

8. The synapse array apparatus according to claim 6, wherein spike timing dependent plasticity is a difference between the spike signal generated by the presynaptic neuron and the spike signal generated by the postsynaptic neuron.

9. The synapse array apparatus according to claim 6, wherein the resistance variable type memory element comprises a selector device.

10. The synapse array apparatus according to claim 9, wherein the selector device is a diode or a transistor.

* * * * *